(12) United States Patent
Morrow et al.

(10) Patent No.: US 6,479,391 B2
(45) Date of Patent: Nov. 12, 2002

(54) METHOD FOR MAKING A DUAL DAMASCENE INTERCONNECT USING A MULTILAYER HARD MASK

(75) Inventors: Patrick Morrow; Jihperng Leu; Chia-Hong Jan, all of Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/746,035

(22) Filed: Dec. 22, 2000

(65) Prior Publication Data

US 2002/0081854 A1 Jun. 27, 2002

(51) Int. Cl.[7] ............................................. H01L 21/302
(52) U.S. Cl. ...................... 438/706; 438/712; 438/717; 438/723; 438/725
(58) Field of Search .................... 438/691–693, 438/637–639, 700–703, 712, 717, 723, 725; 257/751, 752, 758, 759

(56) References Cited

U.S. PATENT DOCUMENTS

| | | | | |
|---|---|---|---|---|
| 6,066,569 A | * | 5/2000 | Tobben ...................... 438/717 |
| 6,156,643 A | * | 12/2000 | Chan et al. ................. 438/703 |
| 6,184,142 B1 | * | 2/2001 | Chung et al. ............... 438/692 |
| 6,291,887 B1 | * | 9/2001 | Wang et al. ................ 257/758 |
| 6,309,962 B1 | * | 10/2001 | Chen et al. ................. 438/700 |
| 6,312,874 B1 | * | 11/2001 | Chan et al. ................. 430/314 |

* cited by examiner

*Primary Examiner*—Benjamin L. Utech
*Assistant Examiner*—Duy-Vu Deo
(74) *Attorney, Agent, or Firm*—Mark V. Seeley

(57) ABSTRACT

An improved method for making a semiconductor device is described. Initially, a structure is formed that includes first and second hard masking layers that cover a dielectric layer. A layer of photoresist is deposited and patterned to expose part of the second hard masking layer to define a via. That exposed part of the second hard masking layer is then etched. A second layer of photoresist is deposited and patterned to expose a second part of the second hard masking layer to define a trench. After etching the exposed second part of the second hard masking layer, a via and trench are etched into the dielectric layer, which are then filled with a conductive material.

7 Claims, 13 Drawing Sheets

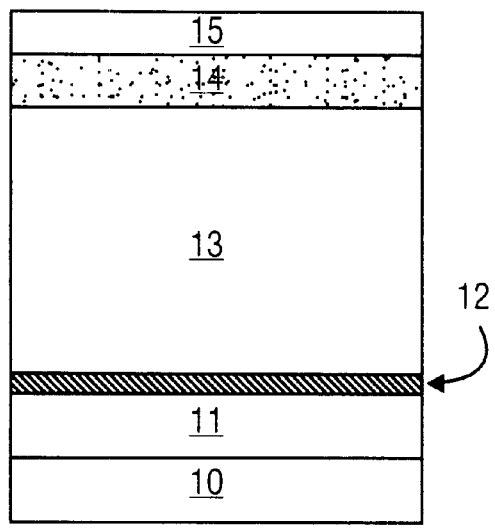
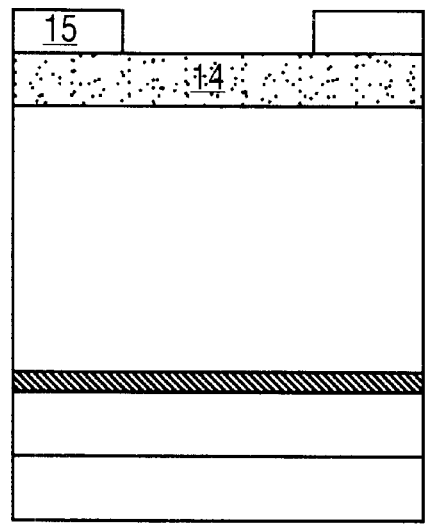
FIG. 1a  FIG. 1b
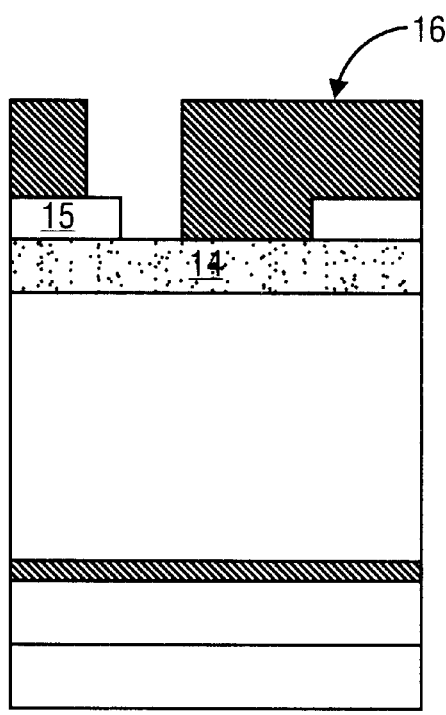
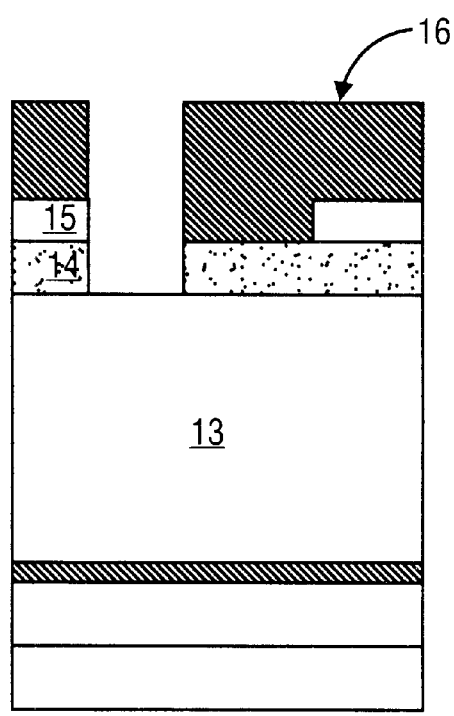
FIG. 1c  FIG. 1d

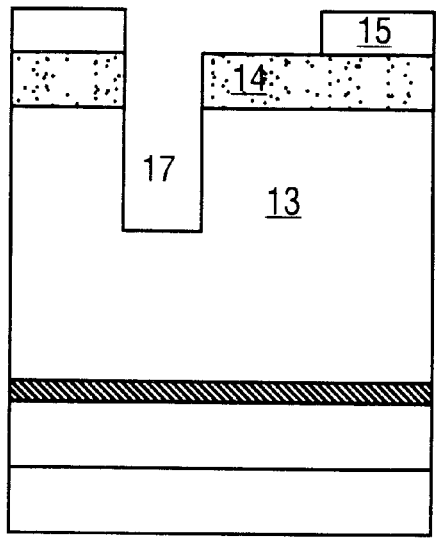
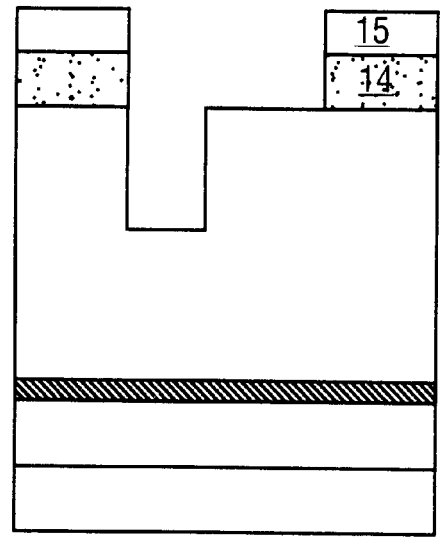
FIG. 1e    FIG. 1f
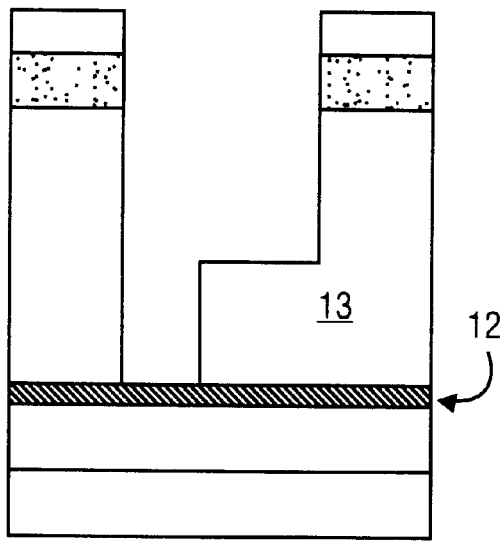
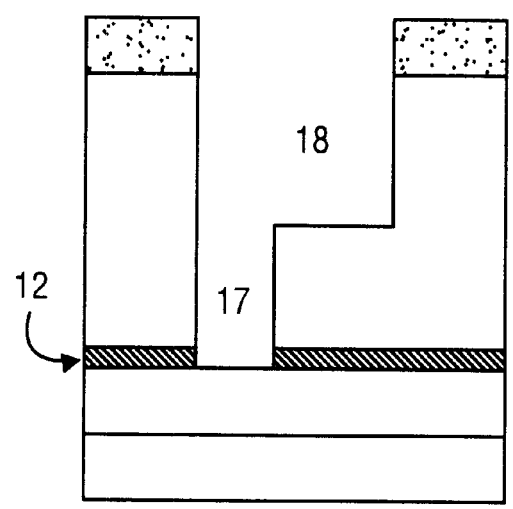
FIG. 1g    FIG. 1h

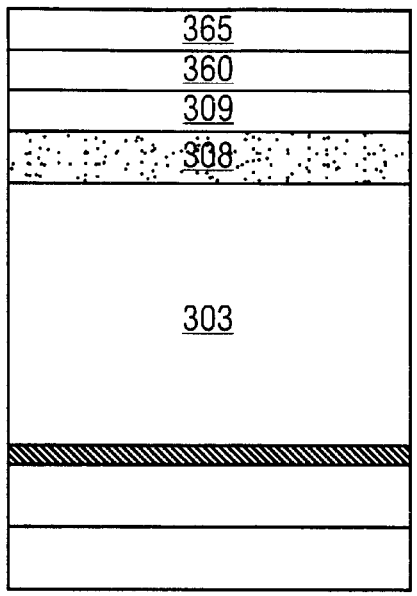
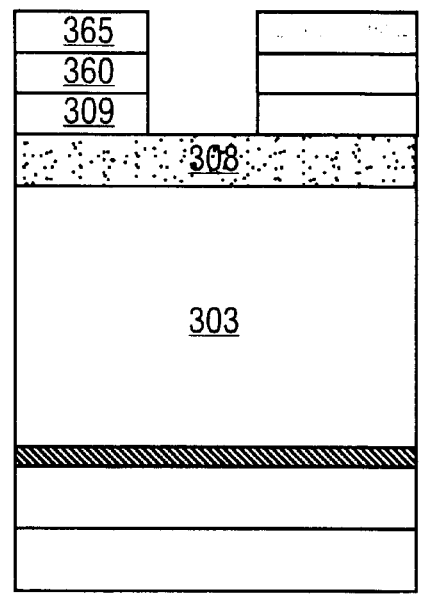
FIG. 3a       FIG. 3b
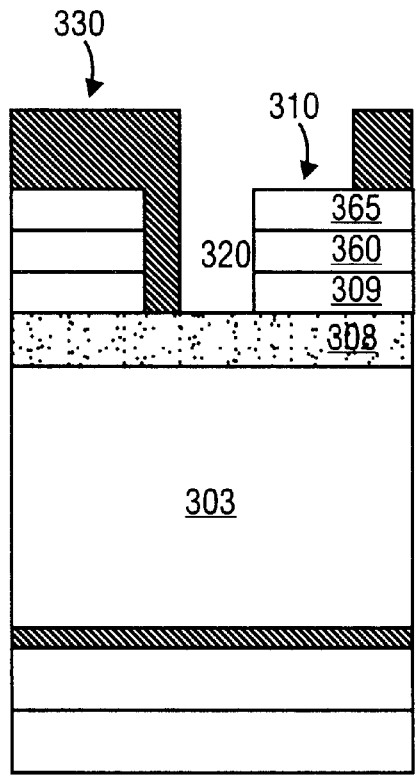
FIG. 3c

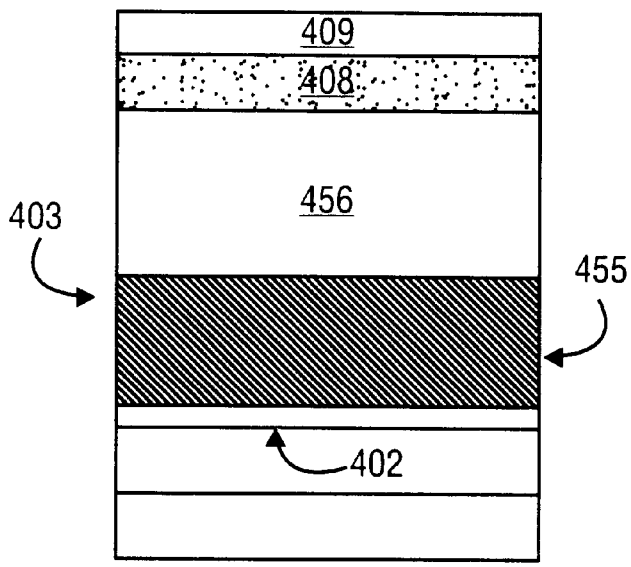
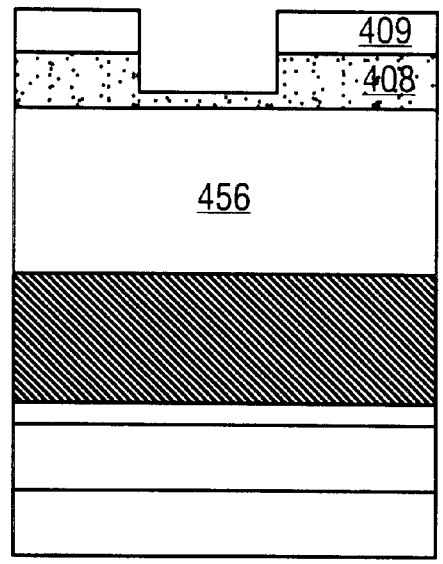
FIG. 4a      FIG. 4b
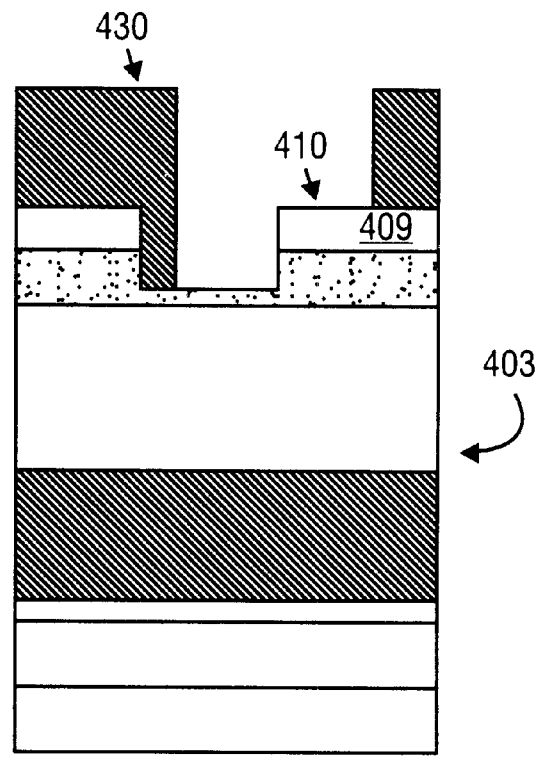
FIG. 4c

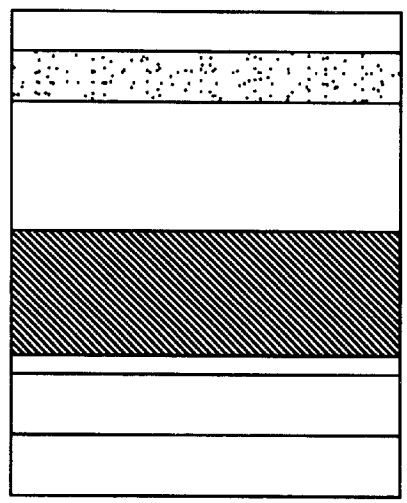
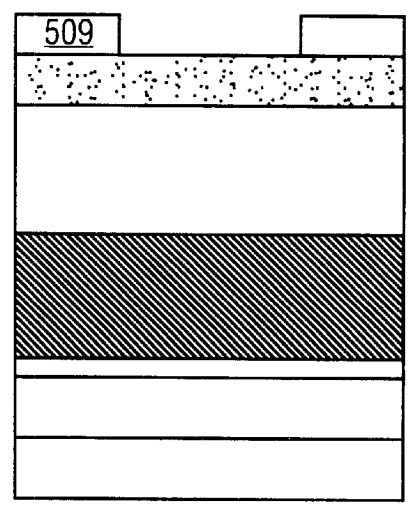
FIG. 5a          FIG. 5b
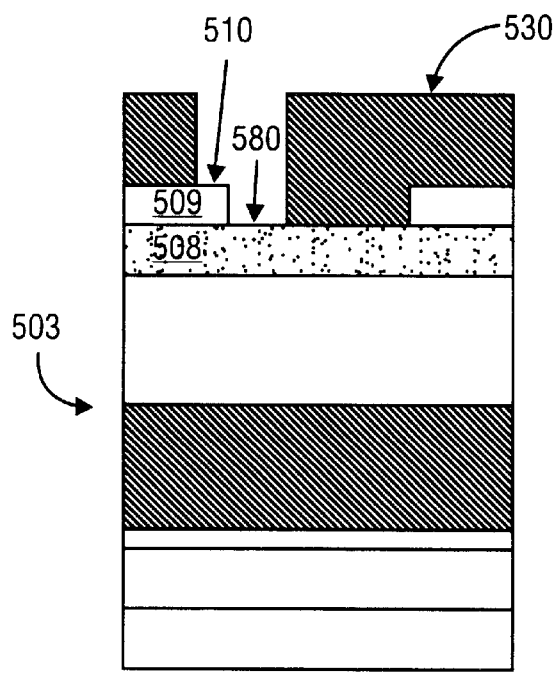
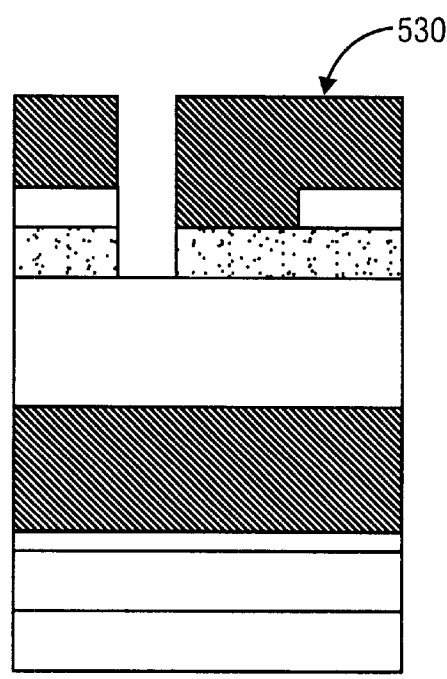
FIG. 5c          FIG. 5d

METHOD FOR MAKING A DUAL DAMASCENE INTERCONNECT USING A MULTILAYER HARD MASK

FIELD OF THE INVENTION

The present invention relates to a method for making semiconductor devices that include dual damascene interconnects.

BACKGROUND OF THE INVENTION

Dual damascene metal interconnects may enable reliable low cost production of integrated circuits using sub 0.25 micron process technology. The lithographic process used to define dual damascene features can be relatively complex. Unlike conventional processes, which only require etching vias through a dielectric layer, processes for making dual damascene structures also require etching trenches into that layer.

One way to form such a device begins by forming a dual hard mask on top of a dielectric layer prior to patterning the trench and via, as illustrated in FIG. 1a. That figure represents a structure that includes a substrate 10 upon which is formed conductive layer 11, barrier layer 12, dielectric layer 13 (e.g., a polymer based film), silicon dioxide hard mask 14 and silicon nitride hard mask 15. In this process for making a dual damascene structure, a trench is then patterned using conventional lithography steps. Etching the portion of silicon nitride hard mask 15 that the photoresist layer did not protect produces the structure illustrated in FIG. 1b. Silicon dioxide hard mask 14 serves as an etch stop for that process step.

Photoresist layer 16 is then deposited and patterned to define a via, as shown in FIG. 1c. Exposed portions of hard masks 14 and 15 are removed, generating the structure shown in FIG. 1d, followed by etching via 17 partially through dielectric layer 13 to produce the structure shown in FIG. 1e. The portion of silicon dioxide hard mask 14 that is not protected by silicon nitride hard mask 15 is then removed, producing the FIG. 1f structure. Dielectric layer 13 is then further etched to produce the structure shown in FIG. 1g. The exposed portion of barrier layer 12 is then removed, as illustrated in FIG. 1h, to complete via 17 and trench 18. That via and trench may then be filled with a conductive material, e.g, copper, using techniques that are well known to those skilled in the art.

As is apparent from FIGS. 1a–1h, this process leaves little room for error when lining up the mask that will define the via. The alignment budget for that mask is, in essence, dictated by the trench's width. Unless part of the mask lines up with part of the trench, separation will result between the subsequently formed via and trench, which will yield an inoperable device. Other problems may arise when a polymer based film is used to make the dielectric layer. Because such a film may have relatively poor mechanical properties, structural instability may result. In addition, using such a film may cause via profile degradation. Using a carbon doped oxide instead may enhance the resulting film's mechanical properties, but may lead to increased etch bias.

Accordingly, there is a need for a process for making a dual damascene interconnect using a multilayer hard mask that will increase the alignment budget for via and trench formation. In addition, there is a need for a process that enhances the mechanical integrity, and the via profile and etch bias, of the resulting interconnect. The method of the present invention provides such a process.

BRIEF DESCRIPTION OF THE DRAWINGS

FIGS. 1a–1h illustrate cross-sections that reflect structures that may result after certain steps are used to make a dual damascene device using a dual hard mask.

FIGS. 3a–3i illustrate cross-sections that reflect structures that may result after certain steps are used to make a copper containing dual damascene device following a second embodiment of the method of the present invention.

FIGS. 4a–4j illustrate cross-sections that reflect structures that may result after certain steps are used to make a copper containing dual damascene device following a third embodiment of the method of the present invention.

FIGS. 5a–5h illustrate cross-sections that reflect structures that may result after certain steps are used to make a copper containing dual damascene device following a fourth embodiment of the method of the present invention.

DETAILED DESCRIPTION OF THE PRESENT INVENTION

Figure 2A:
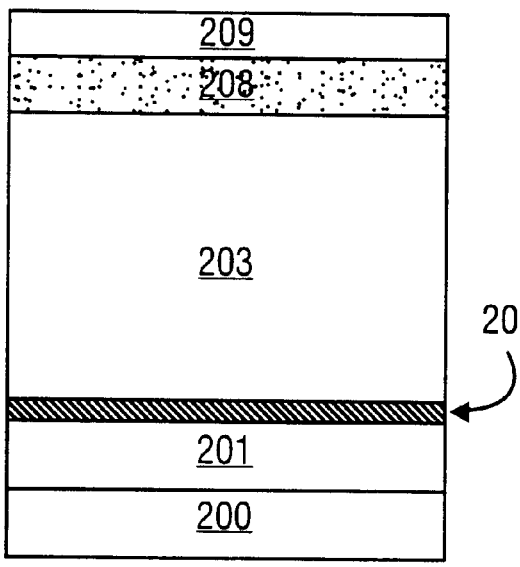
FIGS. 2a–2j illustrate cross-sections that reflect structures that may result after certain steps are used to make a copper containing dual damascene device following one embodiment of the method of the present invention.

A method of forming a semiconductor device is described. That method comprises forming a conductive layer on a substrate, forming a dielectric layer on the conductive layer, forming a first hard masking layer on the dielectric layer, and forming a second hard masking layer on the first hard masking layer. A first layer of photoresist is deposited and patterned to expose a first part of the second hard masking layer to define a via to be etched through the dielectric layer. The exposed first part of the second hard masking layer is then etched. A second layer of photoresist is then deposited and patterned to expose a second part of the second hard masking layer to define a trench to be etched into the dielectric layer. The exposed second part of the second hard masking layer is then etched. A via is then etched through the dielectric layer and a trench is etched into the dielectric layer, which are then filled with a conductive material.

In one embodiment of the present invention, the dielectric layer comprises at least two layers including a first layer that contains an oxide based film and a second layer, which is formed on the first layer, that includes a polymer based film. In embodiments of the present invention that form the dielectric layer from multiple layers, the via and trench may be defined in either order—i.e., trench lithography may precede via lithography, or vice versa.

Set forth below is a description of a number of embodiments of the method of the present invention, presented in the context of using a multilayer hard mask to make a device that includes a copper containing dual damascene interconnect. That description is made with reference to FIGS. 2a–2j, 3a–3i, 4a–4j, and 5a–5h, which illustrate cross-sections of structures that result after using certain steps. In the following description, numerous specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

In the embodiment of the method of the present invention that is illustrated in FIGS. 2a–2j, conductive layer 201 is formed on substrate 200. Substrate 200 may be any surface, generated when making a semiconductor device, upon which a conductive layer may be formed. Substrate 200 may include, for example, active and passive devices that are formed on a silicon wafer such as transistors, capacitors, resistors, diffused junctions, gate electrodes, local interconnects, etc . . . Substrate 200 also may include insulating materials (e.g., silicon dioxide, either undoped or doped with phosphorus (PSG) or boron and phosphorus (BPSG); silicon nitride; silicon oxynitride; silicon carbide; a carbon doped oxide; or a polymer) that separate such active and passive devices from the conductive layer or layers that are formed on top of them, and may include previously formed conductive layers.

Conductive layer 201 may be made from materials conventionally used to form conductive layers for semiconductor devices. For example, conductive layer 201 may be made from copper, a copper alloy, aluminum or an aluminum alloy, such as an aluminum/copper alloy. Alternatively, conductive layer 201 may be made from doped polysilicon or a silicide, e.g., a silicide comprising tungsten, titanium, nickel or cobalt.

Conductive layer 201 may include a number of separate layers. For example, conductive layer 201 may comprise a primary conductor made from an aluminum/copper alloy that is sandwiched between a relatively thin titanium layer located below it and a titanium, titanium nitride double layer located above it. Alternatively, conductive layer 201 may comprise a copper layer formed on underlying barrier and seed layers.

Conductive layer 201 may be formed by a chemical vapor or physical deposition process, like those that are well known to those skilled in the art. Alternatively, where copper is used to make conductive layer 201, a conventional copper electroplating process may be used. Although a few examples of the types of materials that may form conductive layer 201 have been identified here, conductive layer 201 may be formed from various other materials that can serve to conduct electricity within a semiconductor device. Although copper is preferred, the use of any other conducting material, which may be used to make a semiconductor device, falls within the spirit and scope of the present invention.

After forming conductive layer 201 on substrate 200, barrier layer 202 is formed on conductive layer 201. Barrier layer 202 will serve to prevent an unacceptable amount of copper, or other metal, from diffusing into dielectric layer 203. Barrier layer 202 also acts as an etch stop, protecting underlying conductive layer 201 during subsequent via and trench etch and cleaning steps. Barrier layer 202 preferably is made from silicon nitride, but may be made from other materials that can serve such functions, e.g., silicon carbide, silicon oxycarbide or silicon oxynitride, as is well known to those skilled in the art. When formed from silicon nitride, a chemical vapor deposition process may be used to form barrier layer 202. Barrier layer 202 should be thick enough to perform its diffusion inhibition and etch stop functions, but not so thick that it adversely impacts the overall dielectric characteristics resulting from the combination of barrier layer 202 and dielectric layer 203. To balance these two factors, the thickness of barrier layer 202 preferably should be less than about 10% of the thickness of dielectric layer 203. Conductive layer 201 and barrier layer 202 may be planarized, after they are deposited, using a CMP step.

After forming barrier layer 202, dielectric layer 203 is formed on top of that layer. In this embodiment of the present invention, dielectric layer 203 preferably comprises an organic polymer, e.g., a polymer selected from the group that includes polyimides, parylenes, polyarylethers, polynaphthalenes, polyquinolines, bisbenzocyclobutene, polyphenylene, polyarylene, their copolymers or their porous polymers. Commercially available polymers, e.g., those sold by Honeywell, Inc., under the tradename FLARE™ and by the Dow Chemical Company under the tradenames SiLK™ and CYCLOTENE™, may be used to form dielectric layer 203. Such materials may be deposited on the surface of barrier layer 202 using a conventional spin on deposition step.

Dielectric layer 203 preferably has a dielectric constant that is less than about 3.5 and more preferably between about 1.0 and about 3.0. Because of layer 203's low dielectric constant, the capacitance between various conductive elements that are separated by layer 203 should be reduced, when compared to the capacitance resulting from use of other conventionally used dielectric materials—such as silicon dioxide. Such reduced capacitance may decrease the RC delay that would otherwise exist and may also decrease undesirable cross-talk between conductive lines. Although preferably made of an organic polymer, dielectric layer 203 may be made from other materials that may insulate one conductive layer from another, as will be apparent to those skilled in the art. Preferred materials include carbon doped oxides and fluorine doped oxides. Carbon doped oxides may be derived from linear alkylsilanes such as dimethylsiloxane (2MS), trimethylsiloxane (3MS), and tetramethylsiloxane (4MS) with oxidants, siloxanes such as $(CH_3)_2Si(OCH_3)_2$, cyclic siloxanes, and linear siloxanes $[(CH_3)_3SiO]_2$—Si$(CH_3)_2$(OMTSO) with or without oxidants. Other materials that may be used to make dielectric layer 203 include hydrogen silsesquioxane, methyl silsesquioxane, and their derived porous silsesquioxanes, and mesoporous silica. Dielectric layer 203 may be formed from such materials using a conventional chemical vapor deposition or spin on process. Dielectric layer 203 preferably has a thickness of between about 2,000 and about 20,000 angstroms.

A dual hard mask is then formed on dielectric layer 203. That hard mask comprises a first hard masking layer 208 that is formed on dielectric layer 203 and a second hard masking layer 209 that is formed on first hard masking layer 208. As described below, the presence of the dual hard mask enables different portions of dielectric layer 203 to be etched to different depths. First hard masking layer 208 may comprise silicon dioxide and second hard masking layer 209 may comprise silicon nitride, but those layers may be made from other appropriate materials, as is well known to those skilled in the art. First hard masking layer 208 may, for example, include silicon oxyfluoride, silicon oxycarbide, silicon oxynitride, silicon carbide, or carbon doped oxide instead of silicon dioxide. Second hard masking layer 209 may, for example, include silicon carbide, silicon oxycarbide or silicon oxynitride instead of silicon nitride.

Layers 208 and 209 may be formed using conventional chemical vapor deposition processes, and preferably are each between about 100 and 1,000 angstroms thick. Hard masking layer 209 is preferably made from the same material that was used to form barrier layer 202, but those two layers can be made from different materials. FIG. 2a illustrates a cross-section of the structure that results after the dual hard mask is formed on dielectric layer 203.

After forming that dual hard mask, a photoresist layer is deposited and patterned on top of it to define a via formation region for receiving a subsequently deposited conductive material that will contact conductive layer 201. That photoresist layer may be patterned using conventional photolithographic techniques, such as masking the layer of photoresist, exposing the masked layer to light, then developing the unexposed portions. The patterned photoresist leaves exposed a first part of second hard masking layer 209. That exposed portion is then etched using a nonselective plasma etch step, e.g., one that uses fluorocarbon chemistry. A preferred plasma that may be used to perform such an etching step may result from feeding a mixture of $C_4F_8$, oxygen and argon into a conventional plasma etcher. That etcher is operated long enough to cause the plasma to etch through nitride hard mask 209. It may further etch partially through oxide hard mask 208 or alternatively stop when reaching hard masking layer 208. (Unless indicated otherwise, the etching steps described in this application reflect anisotropic dry plasma etch processes.)

Figure 2B:
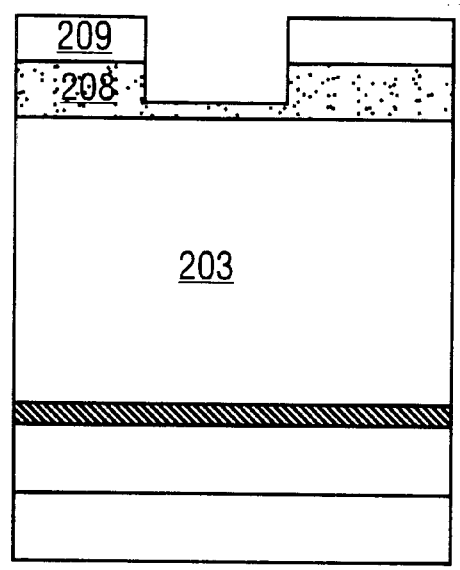

After that etch step, the photoresist is removed such as by applying a conventional photoresist ashing step, e.g. one that applies an oxygen and nitrogen containing plasma to remove the photoresist. The remaining portion of silicon dioxide layer 208 protects dielectric layer 203 during that photoresist removal step. The resulting structure is shown in FIG. 2b.

Figure 2C:
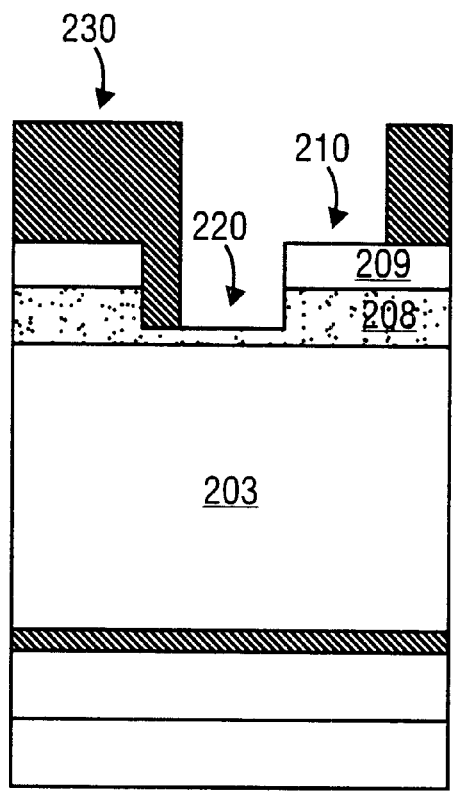
Figure 2D:
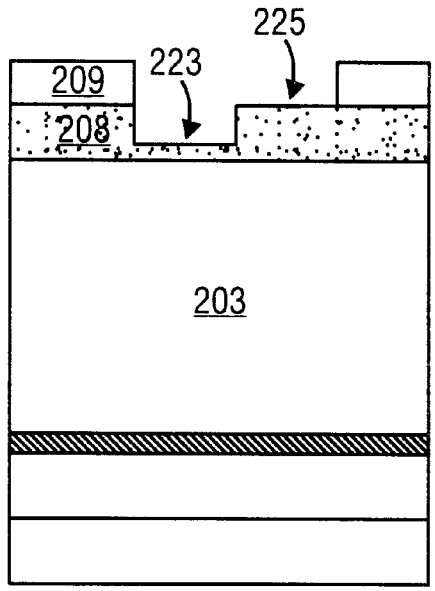

A second layer of photoresist 230 is then deposited and patterned to define the trench to be etched into dielectric layer 203. When patterned, a second part 210 of second hard masking layer 209 is exposed, as shown in FIG. 2c. That figure shows how the patterned photoresist layer 230 may be misaligned with respect to the etched portion 220 of layers 208 and 209, without any adverse impact. As long as part of the region that layer 230 exposes lines up with part of etched portion 220, an acceptable trench and via structure may ultimately result. The process of the present invention thus enables an increased alignment budget, when compared to a process that performs trench lithography before via lithography.

After photoresist layer 230 is patterned, the exposed second part 210 of second hard masking layer 209 is etched, e.g., by using an appropriate fluorocarbon based plasma such as one formed from a mixture of $CH_2F_2$, oxygen and argon. When such a plasma is used to remove second part 210, it may remove a substantial portion of photoresist layer 230 at the same time. Any remaining photoresist may be removed using a conventional oxygen based ashing step to generate the structure illustrated in FIG. 2d. Remaining portion 223 of first hard masking layer 208 protects dielectric layer 203 during that photoresist ashing step.

Figure 2E:
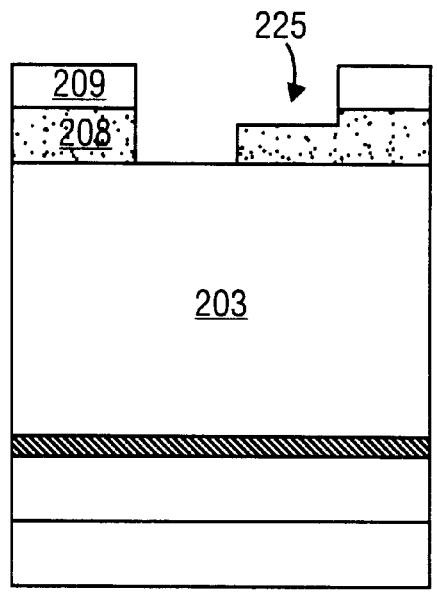

At this point, remaining portion 223 of first hard masking layer 208, which overlies the region where the via will be formed within dielectric layer 203, must be removed. When portion 223 comprises silicon dioxide, a plasma etch process that is conventionally used to remove such a material may be employed, e.g., one that uses fluorocarbon chemistry. A preferred plasma that may be used to perform such an etching step may result from feeding a mixture of $C_4F_8$, carbon monoxide, oxygen and argon into a conventional plasma etcher. That etcher is operated long enough to cause the plasma to etch through portion 223 of oxide hard mask 208, but only long enough to partially etch through section 225 of oxide hard mask 208. Part of section 225 must remain to protect the underlying portion of dielectric layer 203. The resulting structure is shown in FIG. 2e.

Figure 2F:
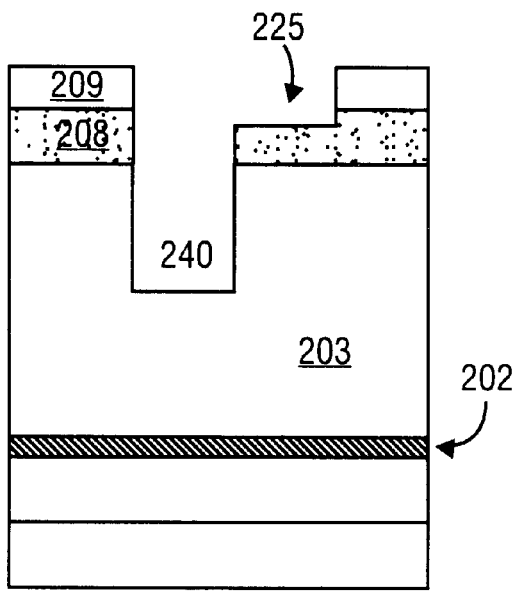
Figure 2G:
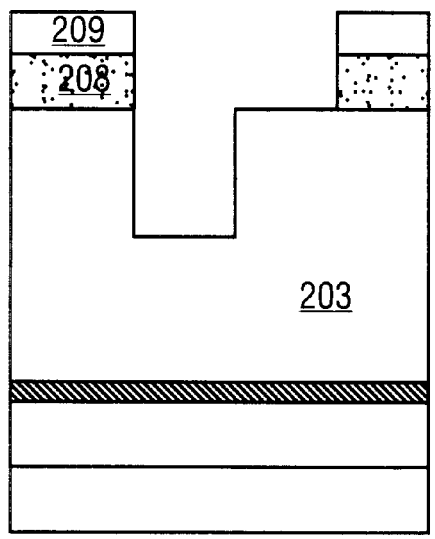

After portion 223 is removed, a first part of via 240 is etched into dielectric layer 203 to generate the structure shown in FIG. 2f. When dielectric layer 203 comprises a polymer based film, a plasma formed from a mixture of oxygen, nitrogen, and carbon monoxide may be used to perform that etch step. That process terminates when via 240 reaches a first depth within dielectric layer 203. This ensures that a subsequent process step for etching the trench will not extend the via through barrier layer 202. Following that via etch step, the remaining portion of section 225 of first hard masking layer 208 is removed—using, for example, the same process that was used previously to remove portion 223, as described above. This generates the FIG. 2g structure.

Figures 2H, 2I:
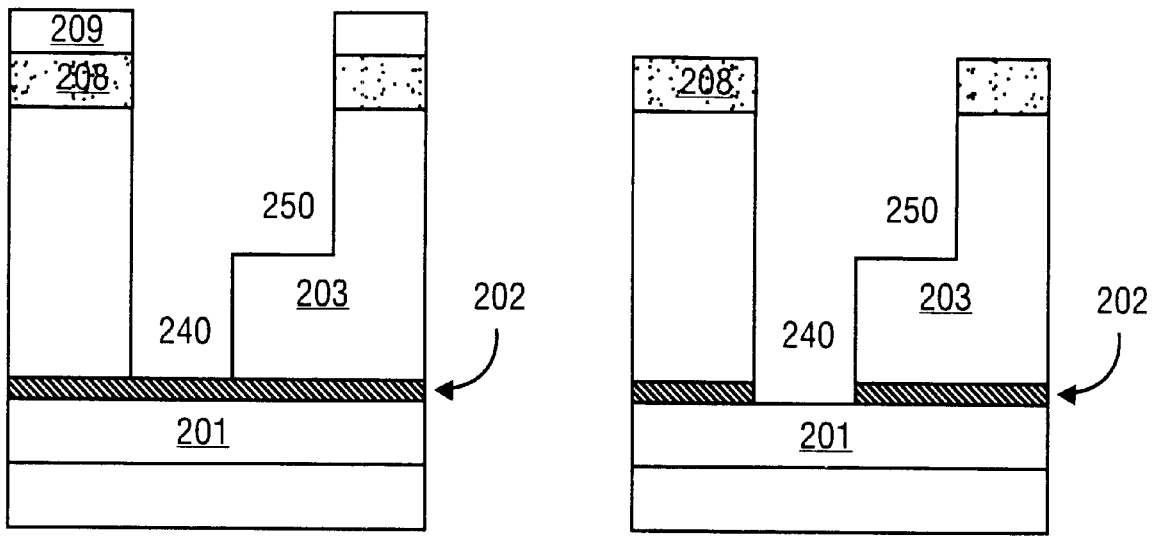

Trench 250 and the remainder of via 240 are then etched into dielectric layer 203 to produce the structure illustrated in FIG. 2h. The same process that was used previously to partially etch via 240 through dielectric layer 203, to generate the structure shown in FIG. 2f, may be used to etch trench 250 and to complete the etching of via 240. That etch process is applied for a time sufficient to form a trench having the desired depth. Because trench 250 and the remaining portion of via 240 are etched at the same time, the etch chemistry chosen to etch trench 250 does not necessarily have to be highly selective to barrier layer 202. If the trench etch terminates at about the time the via etch reaches the barrier layer, barrier layer 202 will not be subjected to that etch process for a significant length of time.

This may provide significant benefits. Because the process of the present invention reduces the amount of time during which barrier layer 202 is etched during the trench etch process, the thickness of barrier layer 202 (e.g., a silicon nitride layer), when initially deposited, may be reduced to less than about 500 angstroms. Reducing the thickness of that layer may help reduce the dielectric constant for the insulating material. In addition, this circumstance enables use of an etch chemistry that may generate vias and trenches with improved, substantially vertical, profiles—without having to consider selectivity to the dielectric layer and the underlying barrier layer. For example, when dielectric layer 203 comprises a polymer based film and barrier layer 202 comprises silicon nitride, it may be desirable to use an etch chemistry that yields improved trench and via profiles without having to worry about its selectivity to silicon nitride.

Because of nonuniformity in the thickness of dielectric layer 203, and polymer etch variability, an overetch step may be necessary. Such an overetch step may consume about 20–30% of barrier layer 202. Conventional post etch via and trench cleaning steps may follow to clean via 240 and trench 250. As mentioned previously, barrier layer 202 protects conductive layer 201 from exposure to any solvents used to clean trench 250 and via 240. After that cleaning step, the portion of barrier layer 202 that separates via 240 from conductive layer 201 may be removed to expose conductive layer 201. The same process that was used previously to remove part 210 of nitride hard masking layer 209, as described above, may be used to remove that portion of barrier layer 202. The remainder of nitride hard masking layer 209 is removed at the same time this portion of barrier layer 202 is etched.

Barrier layer 202 removal may be followed by a short wet etch (which employs an etch chemistry that is compatible with the material used to form conductive layer 201) to clear etch residue from the surface of conductive layer 201. When copper is used to make that conductive layer, that portion of barrier layer 202 should be removed, using a copper compatible chemistry, before any copper electroplating step is applied to fill via 240 and trench 250. Removal of barrier layer 202 produces the structure shown in FIG. 2i.

Following that barrier layer removal step, trench 250 and via 240 are filled with a conductive material to form second conductive layer 205. That conductive material may comprise any of the materials identified above in connection with conductive layer 201. It may comprise the same substance as conductive layer 201, or may comprise a substance different from that used to make conductive layer 201.

The resulting conductive layer 205 preferably comprises copper, and is formed using a conventional copper electroplating process, in which a copper layer is formed on barrier and seed layers used to line trench 250 and via 240. The barrier layer may comprise a refractory material, such as titanium nitride, but may also include an insulating material, such as silicon nitride. Such an insulating barrier layer should be removed from the bottom of the via to allow conductive material 205 to contact the underlying metal. The barrier layer formed beneath conductive layer 205 preferably is between about 100 and 500 angstroms thick. Suitable seed materials for the deposition of copper include copper and nickel.

As with conductive layer 201, although copper is preferred, conductive layer 205 may be formed from various materials that can serve to conduct electricity within a semiconductor device. When an excess amount of the conductive material used to make conductive layer 205 is formed on the surface of layer 208, a CMP step may be applied to remove the excess material and to planarize the surface of layer 205. When an electroplating process is used to form conductive layer 205 from copper, that CMP step removes both the excess copper and the underlying barrier layer. When layer 208 comprises silicon dioxide, that layer may provide a CMP stop layer for such a CMP step. Alternatively, the CMP process may also remove that silicon dioxide layer, then stop at dielectric layer 203.

Figure 2J:
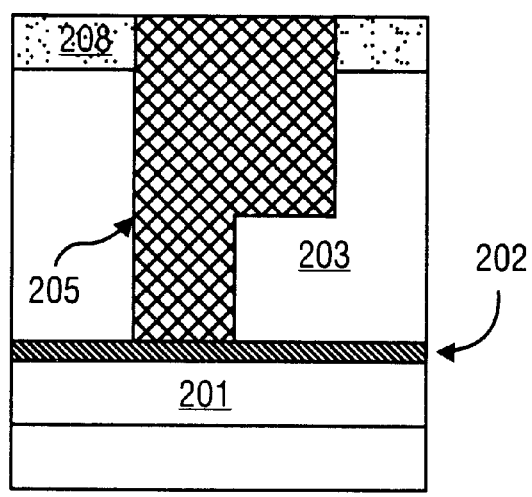

FIG. 2j shows the structure that results after filling trench 250 and via 240 with a conductive material, then applying a CMP step to remove excess material from the surface of layer 208 to produce conductive layer 205. Although the embodiment shown in FIG. 2j shows only one dielectric layer and two conductive layers, the process described above may be repeated to form additional conductive and insulating layers until the desired semiconductor device is produced.

Figure 3D:
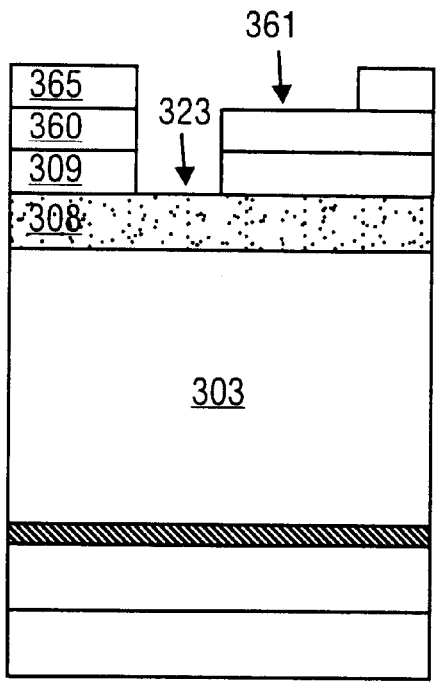

FIGS. 3a–3i represent structures that may be formed when performing a second embodiment of the method of the present invention. FIG. 3a shows a structure similar to the one shown in FIG. 2a, except that third hard masking layer 360 and fourth hard masking layer 365 are formed on second hard masking layer 309. First and third hard masking layers 308 and 360 may comprise silicon dioxide and second and fourth hard masking layers 309 and 365 may comprise silicon nitride. Those layers may be formed using conventional chemical vapor deposition processes, and preferably are each between about 100 and 1,000 angstroms thick.

After forming that four layer hard mask, a photoresist layer is deposited and patterned on top of it to define a via formation region. The patterned photoresist leaves exposed a first exposed part of fourth hard masking layer 365. That portion is then etched using a nonselective plasma etch step, e.g., one created by feeding $C_4F_8$, oxygen and argon into a conventional plasma etcher. That etcher is operated long enough to cause the plasma to etch through layers 365, 360, and 309. After that etch step, the photoresist is removed using a conventional ashing step, e.g., one which employs an oxygen and nitrogen based plasma, to produce the structure shown in FIG. 3b.

A second layer of photoresist 330 is then deposited and patterned to define the trench. When patterned, a second part 310 of fourth hard masking layer 365 is exposed, as shown in FIG. 3c. Like the structure shown in FIG. 2c, patterned photoresist layer 330 is misaligned with respect to the etched portion 320 of layers 365, 360 and 309. After photoresist layer 330 is patterned, the exposed second part 310 of fourth hard masking layer 365 is etched, e.g., by using a plasma formed from feeding a mixture of $CH_2F_2$, oxygen and argon into a plasma etcher. When removing second part 310, a substantial portion of photoresist layer 330 may be removed at the same time. Any remaining photoresist may be removed using a conventional ashing step to generate the structure illustrated in FIG. 3d.

Figure 3E:
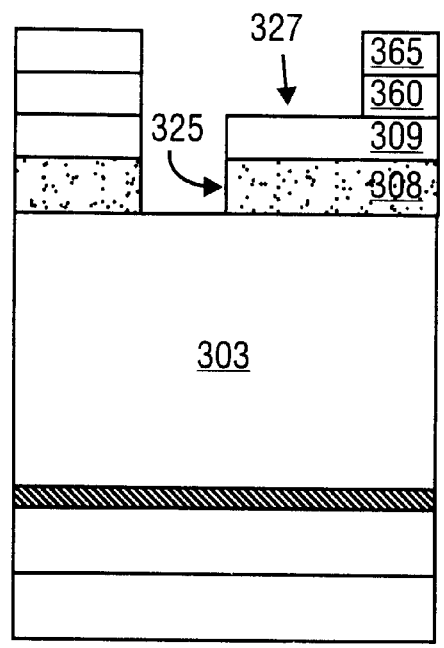

Remaining portion 323 of first hard masking layer 308, which overlies the region where the via will be formed within dielectric layer 303, is then removed at the same time unprotected portion 361 of layer 360 is removed. When portions 323 and 361 comprise silicon dioxide, a plasma etch process that uses a plasma resulting from feeding a mixture of $C_4F_8$, carbon monoxide, oxygen and argon into a plasma etcher may be used. Section 327 of nitride hard mask 309 and section 325 of oxide hard mask 308 remain to protect the underlying portion of dielectric layer 303. The resulting structure is shown in FIG. 3e.

Figure 3F:
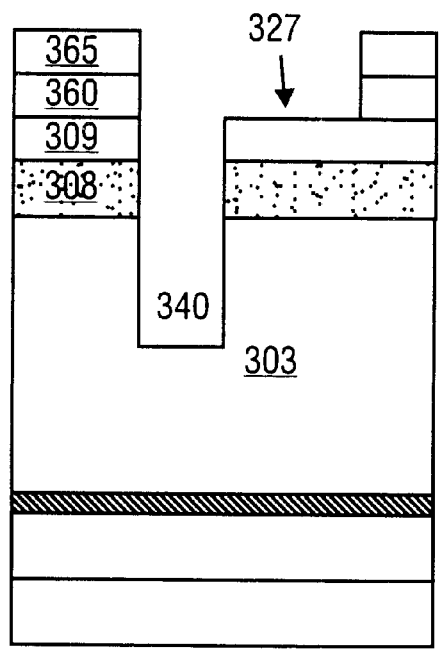
Figure 3G:
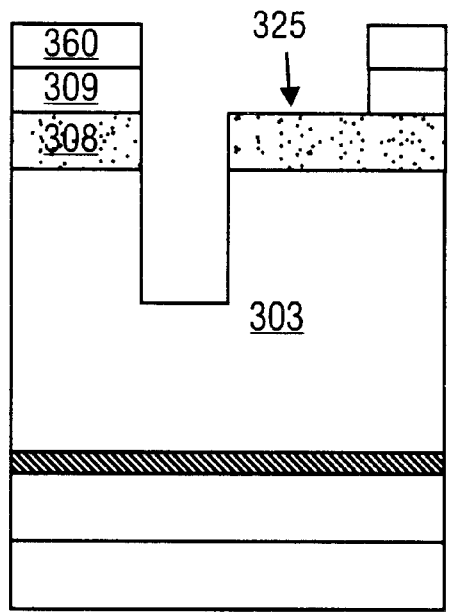

After portion 323 is removed, a first part of via 340 is etched into dielectric layer 303 to generate the structure shown in FIG. 3f. When dielectric layer 303 comprises a polymer based film, a plasma generated from a mixture of hydrogen and nitrogen, or from a mixture of oxygen, nitrogen and carbon monoxide, may be used to perform that etch step. Following that via etch step, unprotected portion 327 of second hard masking layer 309, and the remainder of fourth hard masking layer 365, are removed—using, for example, a plasma formed from feeding a mixture of $CH_2F_2$, oxygen and argon into a plasma etcher. The FIG. 3g structure results.

Figure 3H:
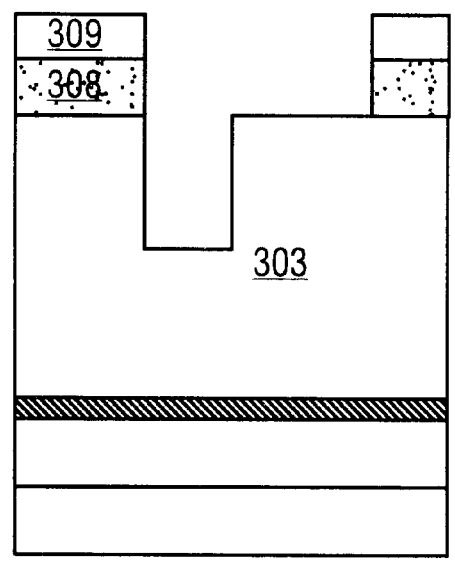
Figure 3I:
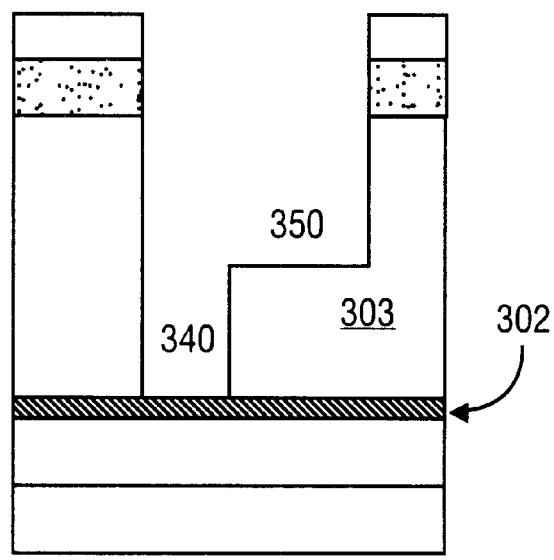

Following that step, unprotected portion 325 of layer 308 and the remainder of third hard masking layer 360 are removed (e.g., by feeding a mixture of $C_4F_8$, carbon monoxide, oxygen and argon into a plasma etcher), creating the structure of FIG. 3h. Trench 350 and the remaining part of via 340 are then etched into dielectric layer 303 to produce the structure illustrated in FIG. 3i using, for example, the same process that was used to partially etch via 340 to generate the structure shown in FIG. 3f. Following that trench etching step, conventional post etch cleaning steps may be performed, as will be apparent to those skilled in the art. The portion of barrier layer 302 that lies underneath via 340 may then be removed and via 340 and trench 350 filled with a conductive material, as described above in connection with FIGS. 2a–2j.

Because barrier layer 302 is not exposed when etching the trench, until the via reaches that layer, the chemistry used to etch the trench need not ensure a high etch rate for dielectric layer 303, when compared to the etch rate for barrier layer 302. No longer constrained by that requirement, the trench etch process may be optimized to yield trenches and vias that have substantially vertical profiles, substantially flat bottom surfaces, and a more controllable depth, without regard for the selectivity that the chosen etch chemistry produces.

Figure 4D:
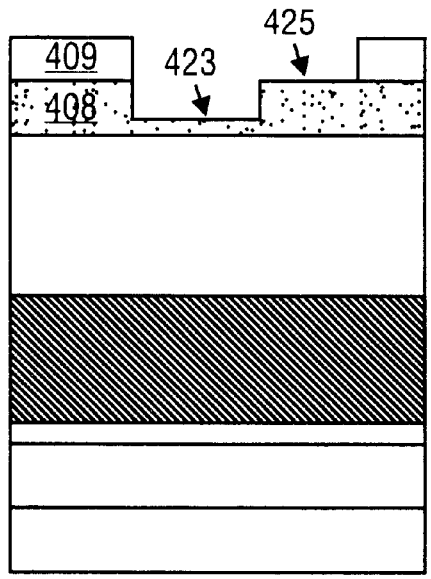
Figure 4E:
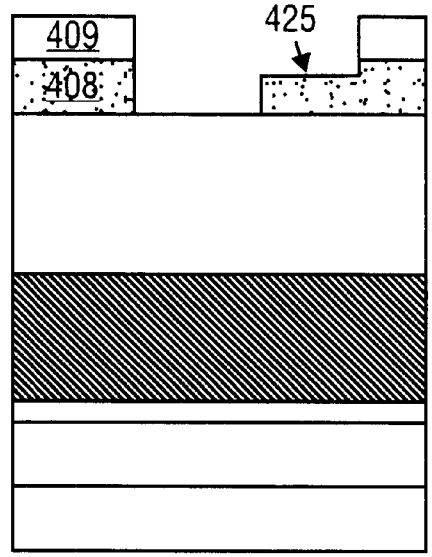

FIGS. 4a–4j illustrate another variation of the process described above in connection with FIGS. 2a–2j. In this variation, FIG. 4a shows a structure similar to the one shown in FIG. 2a, except that dielectric layer 403 comprises oxide based layer 455 (e.g., a layer that includes silicon dioxide, SiOF, or carbon doped oxide), which is covered by polymer based film 456. Oxide based layer 455 may be formed on barrier layer 402 in the conventional manner (e.g., by a conventional spin on or CVD process), prior to applying film 456 to layer 455 using a conventional spin on process. Film 456 and layer 455 preferably have similar dielectric constants to ensure that line-to-line capacitance will not be compromised, while this hybrid dielectric stack enhances mechanical stability. The FIG. 4b structure may be produced by deposited and patterning a photoresist layer to expose part of layer 409, etching through layer 409 and partially through layer 408, then removing the photoresist, as described above in connection with FIG. 2b.

A second layer of photoresist 430 is then deposited and patterned to define the trench to be etched into dielectric layer 403. When patterned, a second part 410 of second hard masking layer 409 is exposed, as shown in FIG. 4c. After photoresist layer 430 is patterned, the exposed second part 410 of second hard masking layer 409 is etched, followed by removing any remaining photoresist, to generate the structure illustrated in FIG. 4d, e.g., by using process steps described above in connection with FIG. 2d. The remaining portion 423 of first hard masking layer 408 is then etched, while retaining part of section 425 of oxide hard mask 408, to produce the structure shown in FIG. 4e. The same process steps described above to produce the structure shown in FIG. 2e may be used here.

Figure 4F:
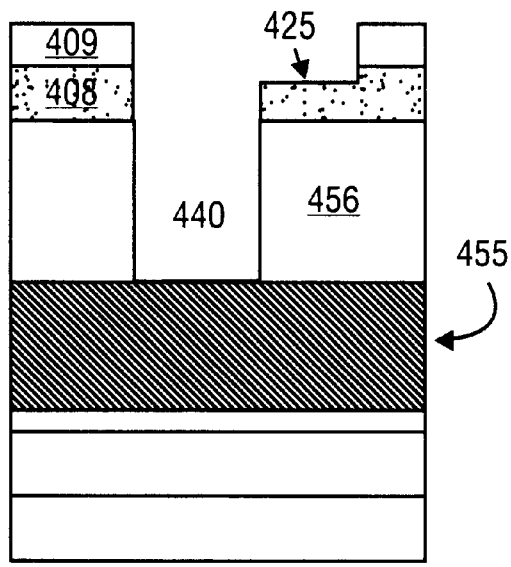
Figure 4G:
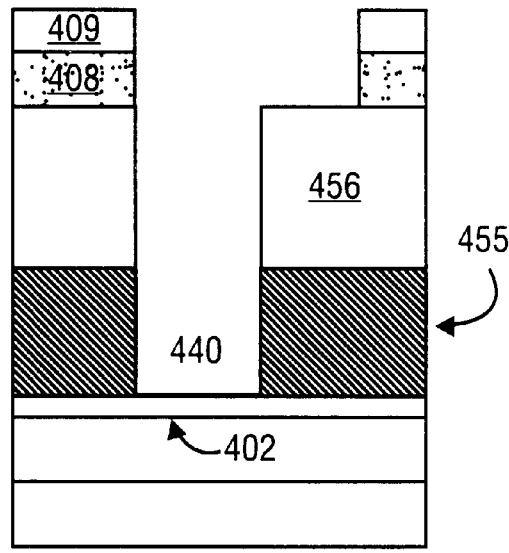

After portion 423 is removed, a first part of via 440 is etched through film 456 until it reaches oxide based layer 455, generating the structure shown in FIG. 4f. A plasma generated from a mixture of oxygen, nitrogen, and carbon monoxide may be used to perform that etch step. That process may stop when via 440 reaches layer 455 because of the high selectivity of that etch chemistry to that layer. Following that via etch step, the remaining portion of section 425 of layer 408 is removed—using, for example, a plasma generated by feeding a mixture of $C_4F_8$, carbon monoxide, oxygen, nitrogen, and argon into a plasma etcher. That process, in addition to removing the remainder of section 425, etches into the exposed part of oxide based layer 455—extending via 440 to barrier layer 402 and generating the structure shown in FIG. 4g.

Figures 4H, 4I:
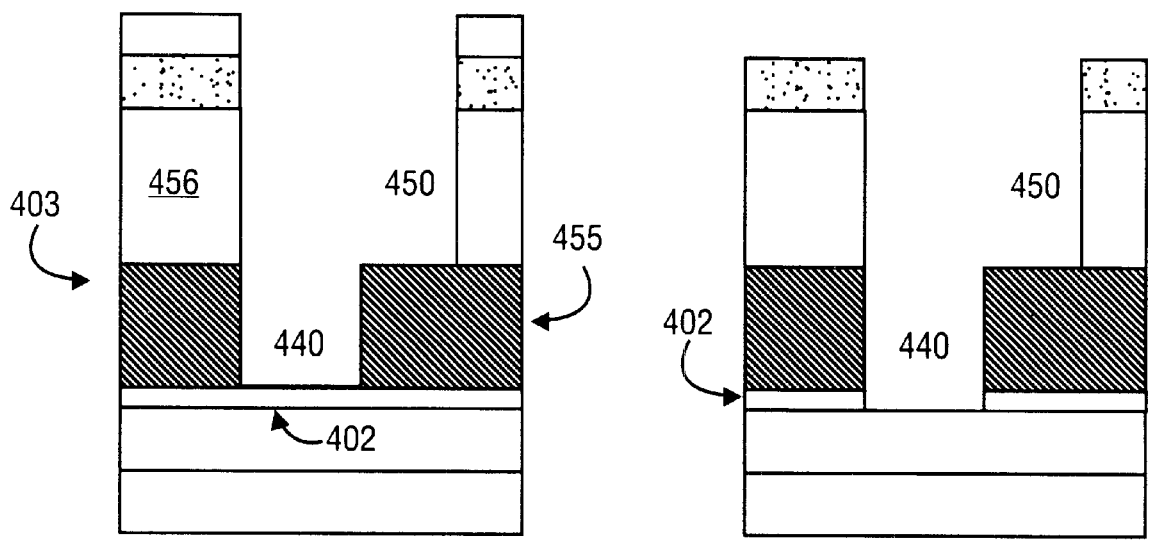
Figure 4J:
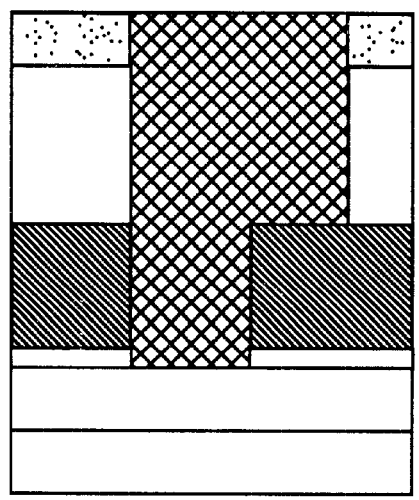

Trench 450 is then etched into dielectric layer 403 to produce the structure illustrated in FIG. 4h. The same process that was used previously to etch via 440 through polymer based film 456 may be used to etch trench 450 through that film. As with that via etch step, the trench etch process will stop when the trench reaches layer 455 because of the high selectivity of that etch chemistry to that layer. The mechanical strength of the resulting structure is increased by locating the harder oxide based material under the trench, enabling that material to support the trench.

The etch chemistry chosen to etch trench 450 should also be highly selective to barrier layer 402 to ensure that the trench etch step will not etch through that layer. The portion of barrier layer 402 that lies underneath via 440 may then be removed to produce the structure shown in FIG. 4i, and via 440 and trench 450 filled with a conductive material to produce the FIG. 4j structure—as described above in connection with FIGS. 2a–2j.

Using a composite dielectric layer, which enables the trench to be formed within the relatively soft polymer based film and the via to be formed within the harder oxide based layer, should enhance the resulting structure's mechanical integrity, rendering it more durable. That property should enable this structure to withstand stresses that will be applied during device fabrication, testing and packaging. Another benefit from using this composite dielectric layer is that the via profile may be preserved during the trench etch process because of the high selectivity of the etch chemistry to the oxide based layer.

FIGS. 5a–5h illustrate a variation of the process just described in connection with FIGS. 4a–4j. In this variation, the process starts with the structure shown in FIG. 5a, which in this embodiment is like the one shown in FIG. 4a. Unlike that process, however, this process performs the trench lithography prior to performing the via lithography. In that regard, a photoresist layer is deposited and patterned over the FIG. 5a structure to define the trench. The exposed portion of layer 509 is then removed, followed by removing the photoresist to produce the structure shown in FIG. 5b. Layer 509 may be etched, for example, by using a plasma generated by feeding a mixture of $CH_2F_2$, carbon monoxide, oxygen, and argon into a plasma etcher.

A second layer of photoresist 530 is then deposited and patterned to define the via to be etched into dielectric layer 503. In this embodiment, the via pattern is misaligned with respect to the trench pattern. When patterned, a second part 510 of second hard masking layer 509 is exposed, as is section 580 of layer 508, as shown in FIG. 5c. After photoresist layer 530 is patterned, the exposed second part 510 of layer 509 and section 580 of layer 508 are etched to generate the structure illustrated in FIG. 5d. An etch process like the one described above in connection with FIG. 2b may be used.

Figure 5E:
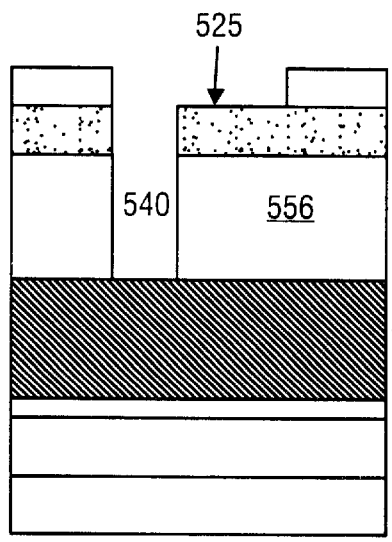
Figure 5F:
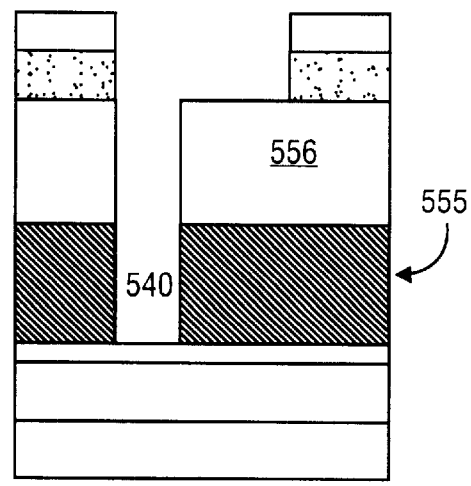

A first part of via 540 may then be etched through film 556 until it reaches oxide based layer 555, generating the structure shown in FIG. 5e. If a plasma formed from a mixture of oxygen, nitrogen, and carbon monoxide is used to perform that etch step, then photoresist layer 530 may be removed at the same time via 540 is etched through layer 556. Following that via etch step, section 525 of layer 508 is removed while etching via 540 through oxide based layer 555 using, for example, the process steps described above in connection with FIG. 4g, to generate the structure shown in FIG. 5f.

Figure 5G:
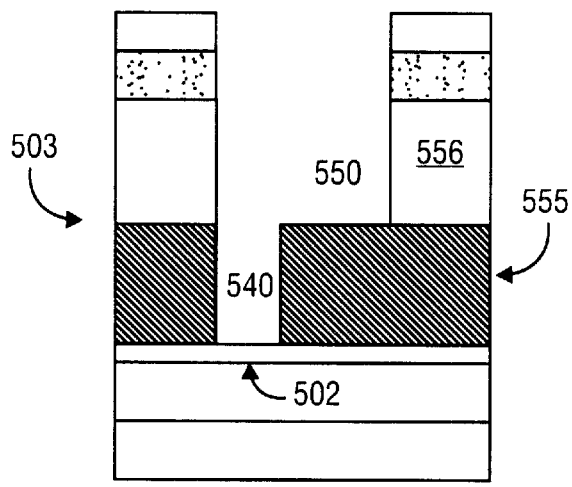
Figure 5H:
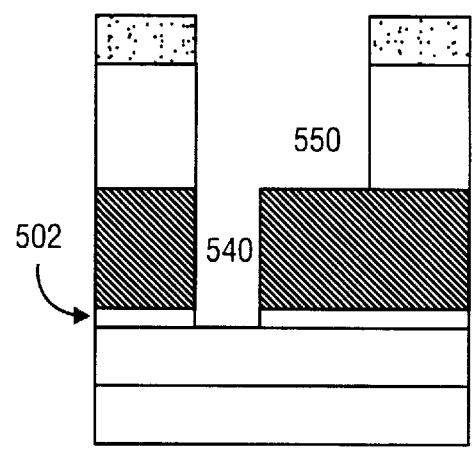

Trench 550 is then etched into dielectric layer 503 to produce the structure illustrated in FIG. 5g. The same process that was used previously to etch via 540 through polymer based film 556 may be used to etch trench 550 through that film. The portion of barrier layer 502 that lies underneath via 540 may then be removed to produce the structure shown in FIG. 5h, and via 540 and trench 550 filled with a conductive material, as described above in connection with FIGS. 2a–2j.

The improved method for making a semiconductor device of the present invention, which performs via lithography prior to trench lithography to make a dual damascene structure using a multilayer hard mask, increases the alignment budget for via and trench formation. In doing so, such a method enables photoresist to be removed while protecting the dielectric layer. When the dielectric layer includes an oxide based layer that is covered by a polymer based film, the method of the present invention also promotes superior via and trench profiles and increased mechanical strength.

Although the foregoing description has specified certain steps, materials, and equipment that may be used in such a method to make a semiconductor device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a semiconductor device comprising:

forming a conductive layer on a substrate;

forming a dielectric layer on the conductive layer;

forming a first hard masking layer on the dielectric layer;

forming a second hard masking layer on the first hard masking layer;

forming a third hard masking layer on the second hard masking layer;

forming a fourth hard masking layer on the third hard masking layer;

depositing a first layer of photoresist and then patterning that first layer to expose a first part of the fourth hard masking layer to define a via to be etched through the dielectric layer;

etching through the exposed first part of the fourth hard masking layer and through the underlying portions of the third and second hard masking layers;

depositing a second layer of photoresist and then patterning that second layer to expose a second part of the fourth hard masking layer to define a trench to be etched through the dielectric layer;

etching through the exposed second part of the fourth hard masking layer;

etching through the portion of the third hard masking layer that had lain beneath the exposed second part of the fourth hard masking layer while etching through the portion of the first hard masking layer that had lain beneath the exposed first part of the fourth hard masking layer to expose a first portion of the dielectric layer;

etching a via and trench into the dielectric layer; and filling the via and trench with a conductive material.

2. The method of claim 1 further comprising:

forming a barrier layer on the surface of the conductive layer prior to forming the dielectric layer; and removing part of the barrier layer before filling the via and trench with the conductive material.

3. The method of claim 2 further comprising:

etching into the exposed first portion of the dielectric layer to a first depth, after etching through the portion of the first hard masking layer that had lain beneath the exposed first part of the fourth hard masking layer;

removing the portions of the second hard masking layer and the first hard masking layer that had lain beneath the exposed second part of the fourth hard masking layer to expose a second portion of the dielectric layer; and etching into both the first and second exposed portions of the dielectric layer to form the via and trench.

4. The method of claim 3 wherein the first and third hard masking layers include a material that is selected from the group consisting of silicon dioxide, silicon oxyfluoride, silicon oxycarbide, silicon oxynitride, silicon carbide, and carbon doped oxide, and the second and fourth hard masking layers include a material that is selected from the group consisting of silicon nitride, silicon carbide, silicon oxycarbide, and silicon oxynitride.

5. The method of claim 4 wherein the dielectric layer comprises an organic polymer selected from the group consisting of polyimides, parylenes, polyarylethers, polynaphthalenes, polyquinolines, bisbenzocyclobutene, polyphenylene, polyarylene, their copolymers and their porous polymers, the barrier layer comprises silicon nitride, and both the conductive layer and conductive material comprise copper.

6. A method of forming a semiconductor device comprising:

forming a conductive layer on a substrate;

forming a barrier layer on the surface of the conductive layer;

forming a first dielectric layer that contains an oxide on the barrier layer;

forming a second dielectric layer that contains a polymer based film on the first dielectric layer;

forming a first hard masking layer on the second dielectric layer;

forming a second hard masking layer on the first hard masking layer;

depositing a first layer of photoresist and then patterning that first layer to expose a first part of the second hard masking layer to define a via to be etched through the first and second dielectric layers;

etching through the exposed first part of the second hard masking layer;

depositing a second layer of photoresist and then patterning that second layer to expose a second part of the second hard masking layer to define a trench to be etched through the second dielectric layer;

etching through the exposed second part of the second hard masking layer;

etching through a first portion of the first hard masking layer to expose a first portion of the second dielectric layer;

etching a via through the second dielectric layer;

etching through a second portion of the first hard masking layer to expose a second portion of the second dielectric layer while etching the via through the first dielectric layer;

etching through the second exposed portion of the second dielectric layer to form a trench; and removing the part of the barrier layer that underlies the via before filling the via and trench with a conductive material.

7. A method of forming a semiconductor device comprising:

forming a conductive layer on a substrate;

forming a barrier layer on the surface of the conductive layer;

forming a first dielectric layer that contains an oxide on the conductive layer;

forming a second dielectric layer that contains a polymer based film on the first dielctric layer;

forming a first hard masking layer on the second dielectric layer;

forming a second hard masking on the first hard masking layer;

depositing a first layer of photoresist and then patterning that first layer to expose a first part of the second hard masking layer to define a trench to be etched through the second dielectric layer;

etching through the exposed first part of the second hard masking layer;

depositing a second layer of photoresist and then patterning that second layer to expose a first part of the first hard masking layer to define a via to be etched through the first and second dielectric layers;

etching through a second part of the second hard masking layer; then etching through the exposed first part of the first hard masking layer to expose a first portion of the second dielectric layer;

etching a via through the second dielectric layer removing a second portion of the first hard masking layer to expose a second portion of the second dielectric layer while etching the via through the first dielectric layer;

etching through the second exposed portion of the second dielectric layer to form a trench; and removing the part of the barrier layer that underlies the via before filling the via and trench with a conductive material.

* * * * *